United States Patent
Nagano et al.

(10) Patent No.: US 8,594,270 B2
(45) Date of Patent: Nov. 26, 2013

(54) DISPLAY PANEL DRIVE DEVICE

(71) Applicant: Panasonic Corporation, Kadoma (JP)

(72) Inventors: Tetsu Nagano, Osaka (JP); Daijiro Arisawa, Kyoto (JP); Kenichi Ishibashi, Hyogo (JP); Yoshiteru Fujimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/733,836

(22) Filed: Jan. 3, 2013

(65) Prior Publication Data

US 2013/0114782 A1    May 9, 2013

Related U.S. Application Data

(63) Continuation of application No. PCT/JP2011/003180, filed on Jun. 6, 2011.

(30) Foreign Application Priority Data

Jul. 30, 2010   (JP) .................. 2010-171686

(51) Int. Cl.
   *G11C 19/00*   (2006.01)
(52) U.S. Cl.
   USPC .................. 377/64; 377/69; 377/77; 377/81
(58) Field of Classification Search
   None
   See application file for complete search history.

(56) References Cited

U.S. PATENT DOCUMENTS

| | | | | |
|---|---|---|---|---|
| 4,180,813 A | * | 12/1979 | Yoneda | 345/100 |
| 4,742,346 A | * | 5/1988 | Gillette et al. | 345/89 |
| 5,101,203 A | * | 3/1992 | Gersbach et al. | 341/100 |
| 6,437,766 B1 | | 8/2002 | Matsushima et al. | |
| 6,630,920 B1 | * | 10/2003 | Maekawa et al. | 345/100 |
| 2002/0163493 A1 | | 11/2002 | Matsushima et al. | |
| 2005/0057549 A1 | | 3/2005 | Tachibana et al. | |
| 2005/0175138 A1 | * | 8/2005 | Matsuda et al. | 377/64 |
| 2009/0122038 A1 | | 5/2009 | Tachibana et al. | |
| 2009/0267924 A1 | * | 10/2009 | Shimizu et al. | 345/204 |
| 2011/0267333 A1 | * | 11/2011 | Sakamoto et al. | 345/211 |

FOREIGN PATENT DOCUMENTS

| | | |
|---|---|---|
| JP | 5-313129 A | 11/1993 |
| JP | 9-243993 A | 9/1997 |
| JP | 11-296129 A | 10/1999 |
| JP | 11-338429 A | 12/1999 |
| JP | 2002-132203 A | 5/2002 |
| JP | 2005-070673 A | 3/2005 |

OTHER PUBLICATIONS

International Search Report issued in International Application No. PCT/JP2011/003180 mailed on Jul. 26, 2011.

* cited by examiner

*Primary Examiner* — Tuan T Lam (74) *Attorney, Agent, or Firm* — McDermott Will & Emery LLP (57) ABSTRACT

A display panel drive device includes: a ring counter circuit that includes a first ring counter having a plurality of flipflops connected in cascade, configured to operate in synchronization with a first clock signal with a first-stage one of the plurality of flipflops being set by an initial signal, and outputs signals using outputs of the plurality of flipflops; a shift register having a plurality of flipflops connected in cascade, configured to operate in synchronization with a second clock signal lower in frequency than the first clock signal with a first-stage one of the plurality of flipflops being set by the initial signal; and an output section configured to perform a logical operation between one of outputs of the ring counter circuit and one of outputs of the shift register, to generate a scanning line drive signal for a display panel.

8 Claims, 9 Drawing Sheets

DISPLAY PANEL DRIVE DEVICE

CROSS-REFERENCE TO RELATED APPLICATION

This is a continuation of PCT International Application PCT/JP2011/003180 filed on Jun. 6, 2011, which claims priority to Japanese Patent Application No. 2010-171686 filed on Jul. 30, 2010. The disclosures of these applications including the specifications, the drawings, and the claims are hereby incorporated by reference in their entirety.

BACKGROUND

The present disclosure relates to a display panel drive device, and more particularly to generation of scanning line drive signals for a display panel.

In recent years, display panels such as plasma display panels, liquid crystal display panels, and electroluminescence panels have been used in many electronic apparatuses. In particular, high-definition display panels having 1,000 or more scanning lines are used in digital TV apparatuses.

In general, in a display panel, a frame is displayed by driving scanning lines sequentially. The sequential driving of scanning lines can be achieved using a shift register that includes the number of flipflops equal to the number of scanning lines. When such a shift register is applied to a digital TV apparatus, however, 1,000 or more flipflops will be necessary, and this will increase the circuit scale and cost of a display panel drive device. To solve this problem, arrangement is made to drive two scanning lines by one flipflop, thereby halving the total number of flipflops required (see Japanese Patent Publication No. 2002-132203, for example).

In the conventional technique described above, although the total number of flipflops can be halved, it is still necessary to provide 500 or more flipflops. Moreover, when the definition of display panels becomes higher and higher in future, the number of flipflops required will continue to increase, and thus the circuit scale will become increasingly larger.

In view of the problem described above, it is an objective of the present disclosure to provide a display panel drive device small in circuit area.

SUMMARY

To achieve the above objective, the present disclosure provides the following resolution. The display panel drive device of the present disclosure includes: a ring counter circuit that includes a first ring counter having a plurality of flipflops connected in cascade, configured to operate in synchronization with a first clock signal with a first-stage one of the plurality of flipflops being set by an initial signal, and outputs signals using outputs of the plurality of flipflops; a shift register having a plurality of flipflops connected in cascade, configured to operate in synchronization with a second clock signal lower in frequency than the first clock signal with a first-stage one of the plurality of flipflops being set by the initial signal; and an output section configured to perform a logical operation between one of outputs of the ring counter circuit and one of outputs of the shift register, to generate a scanning line drive signal for a display panel.

With the above configuration, it is possible to generate the number of scanning line drive signals corresponding to the product of the numbers of flipflops of the ring counter circuit and the shift register at the maximum. In other words, the total number of flipflops can only be the order of the square root of the number of scanning line drive signals.

The ring counter circuit and the shift register may be configured such that the first-stage one of the plurality of flipflops and the shift direction can be changed according to a common control signal. Alternatively, either one of the ring counter circuit and the shift register may have a connection switch section that switches connections between output terminals of the plurality of flipflops and output terminals of the ring counter circuit or the shift register, between straight connection and reverse connection, according to a control signal, and the other may be configured such that the first-stage one of the plurality of flipflops and the shift direction can be changed according to the control signal. Otherwise, both the ring counter circuit and the shift register may each have a connection switch section that switches connections between output terminals of the plurality of flipflops and output terminals of the ring counter circuit or the shift register, between straight connection and reverse connection, according to a control signal.

The display panel drive device may further include a reset circuit configured to reset the first ring counter. With this configuration, the first ring counter can be reset at arbitrary timing.

For example, the ring counter circuit may further include: a second ring counter having a plurality of flipflops connected in cascade, configured to operate in synchronization with a third clock signal lower in frequency than the first clock signal with the first-stage one of the plurality of flipflops being set by the initial signal; and an output section configured to perform a logical operation between one of outputs of the first ring counter and one of outputs of the second ring counter, to generate an output of the ring counter circuit.

Alternatively, the ring counter circuit may have a plurality of ring counters, including the first ring counter, configured to operate in synchronization with clock signals different in frequency from each other, performs a logical operation between outputs, one each, of the plurality of ring counters, and outputs the result of the logical operation as one of the outputs of the ring counter circuit.

According to the present disclosure, the circuit area of a display panel drive device can be reduced.

DETAILED DESCRIPTION

<First Embodiment>

Figure 1:
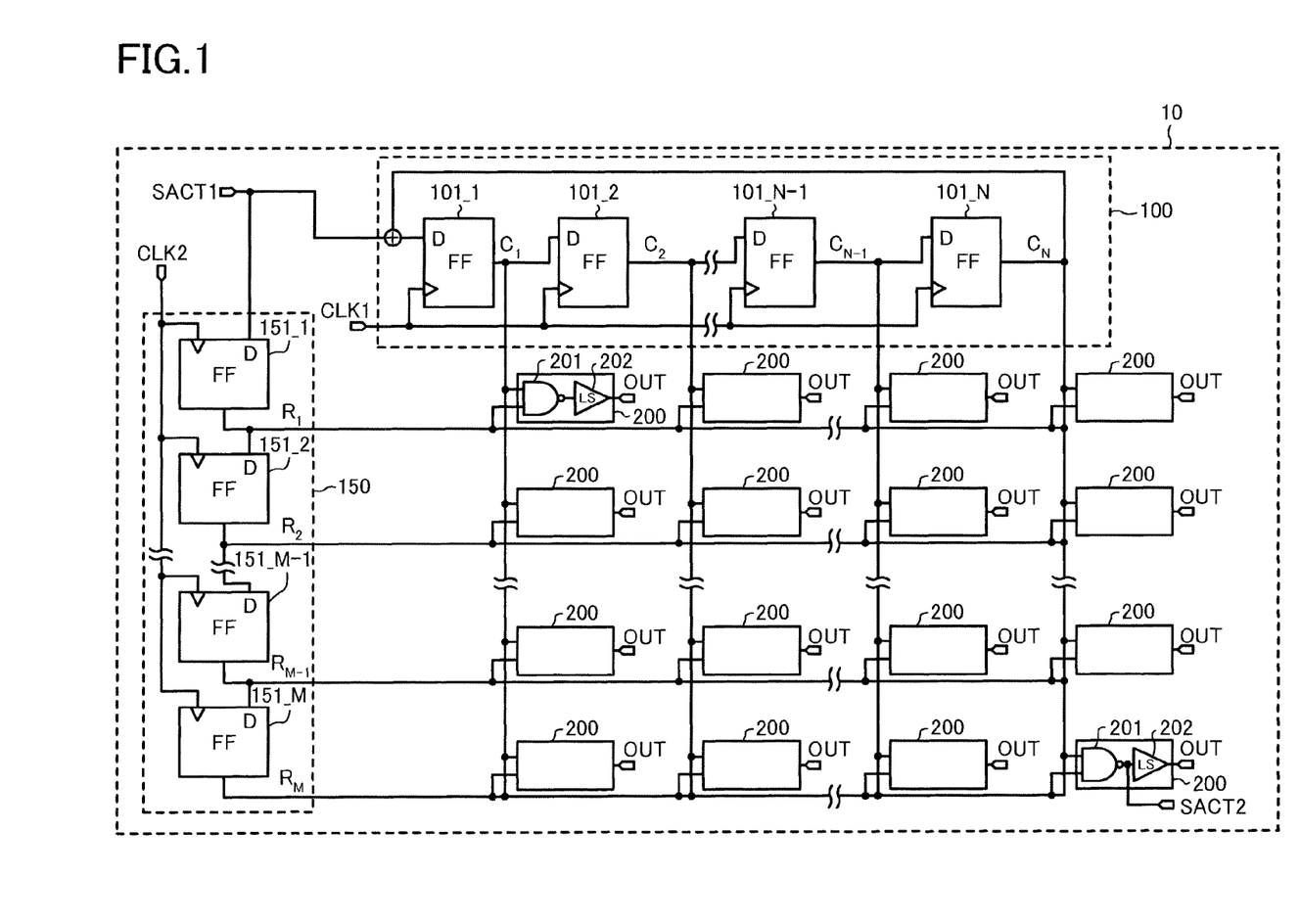
FIG. 1 is a block diagram of a display panel drive device of the first embodiment.

FIG. 1 is a block diagram of a display panel drive device of the first embodiment. The display panel drive device 10 outputs scanning line drive signals OUT sequentially in the order from top left to bottom right as viewed from FIG. 1. The number of OUTs is about 100, for example, and, by cascading a plurality of such display panel drive devices 10, 1,000 or more scanning lines are sequentially driven. SACT2 output from the display panel drive device 10 in a given stage serves as SACT1 for the display panel drive device 10 in the next stage.

The display panel drive device 10 can be comprised of a ring counter circuit 100, a shift register 150, and a plurality of output sections 200 that generate OUT. The ring counter circuit 100 has one ring counter (first ring counter), for example, which can be comprised of N stages of flipflops 101_1 to 101_N connected in cascade. The flipflops 101_1 to 101_N operate in synchronization with a clock signal CLK1 and output signals C1 to CN, respectively. The signals C1 to CN are output from the ring counter circuit 100 as they are. The first-stage flipflop 101_1 receives a signal obtained by logically combining a scanning line active signal SACT1 as the initial signal and the output CN of the final-stage flipflop 101_N. Note that, if the first-stage flipflop 101_1 has a set terminal, it may be directly set by SACT1.

Figure 3:
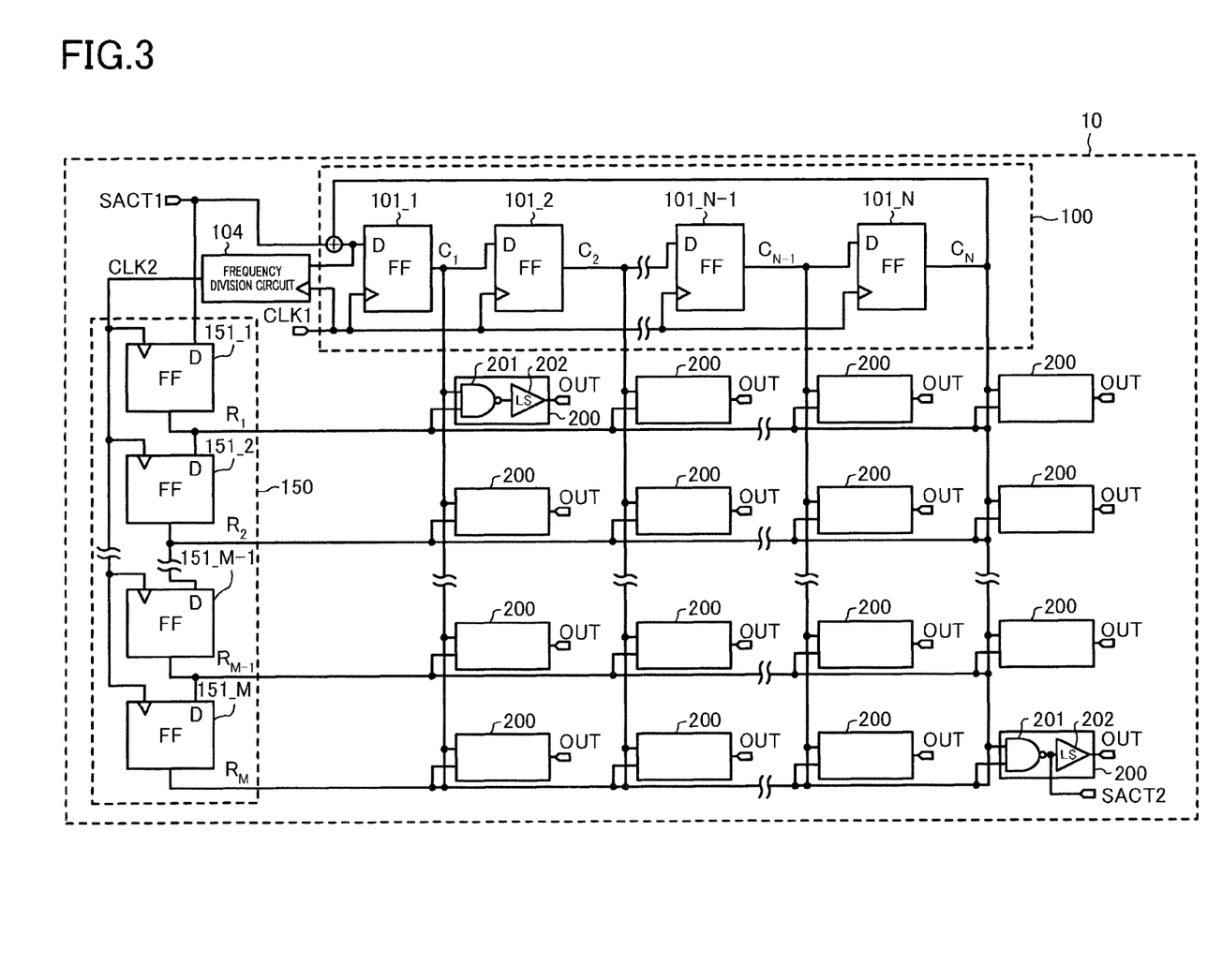
FIG. 3 is a block diagram of an alteration of the display panel drive device of FIG. 1.
Figure 4:
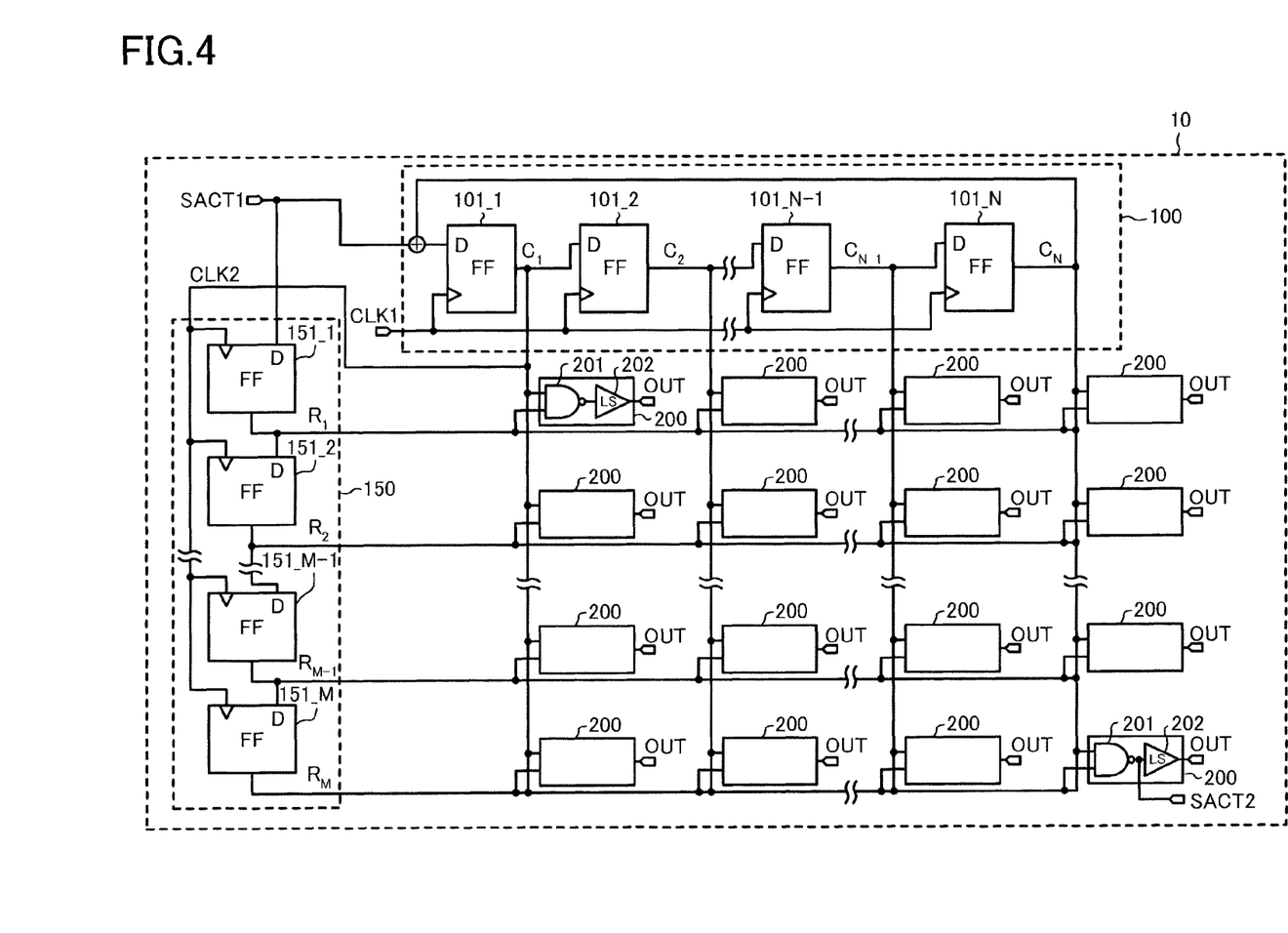
FIG. 4 is a block diagram of another alteration of the display panel drive device of FIG. 1.

The shift register 150 can be comprised of M stages of flipflops 151_1 to 151_M connected in cascade. The flipflops 151_1 to 151_M operate in synchronization with a clock signal CLK2 and output signals R1 to RM, respectively. CLK2 is a signal lower in frequency than CLK1. For example, it is a signal obtained by dividing the frequency of CLK1 by N. Alternatively, as shown in FIG. 3, a frequency division circuit 104 may divide the frequency of CLK1 by N to generate CLK2 (see FIG. 3). Otherwise, as shown in FIG. 4, the output of any one flipflop among the flipflops 101_1 to 101_N constituting the ring counter, e.g., the output C1 of the flipflop 101_1, may be used as CLK2 (see FIG. 4). Returning back to FIG. 1, the first-stage flipflop 151_1 receives SACT1.

The output sections 200 have similar configurations to one another. Herein, therefore, description will be made using the configuration of the top-left output section 200 as viewed from FIG. 1. The output section 200 can be comprised of a logic circuit 201 and a level shifter 202. The logic circuit 201 can be comprised of a NAND that performs a logical operation between the output C1 of the flipflop 101_1 as one of the outputs of the ring counter circuit 100 and the output R1 of the flipflop 151_1 as one of the outputs of the shift register 150. The logic circuit 201 of the bottom-right output section 200 performs a logical operation between CN and RM and outputs the result as SACT2. A flipflop may be inserted between the result of the logical operation between CN and RM and SACT2, to adjust the output timing of SACT2. Also, a through current prevention circuit may be connected between the logic circuit 201 and the level shifter 202.

Figure 2:
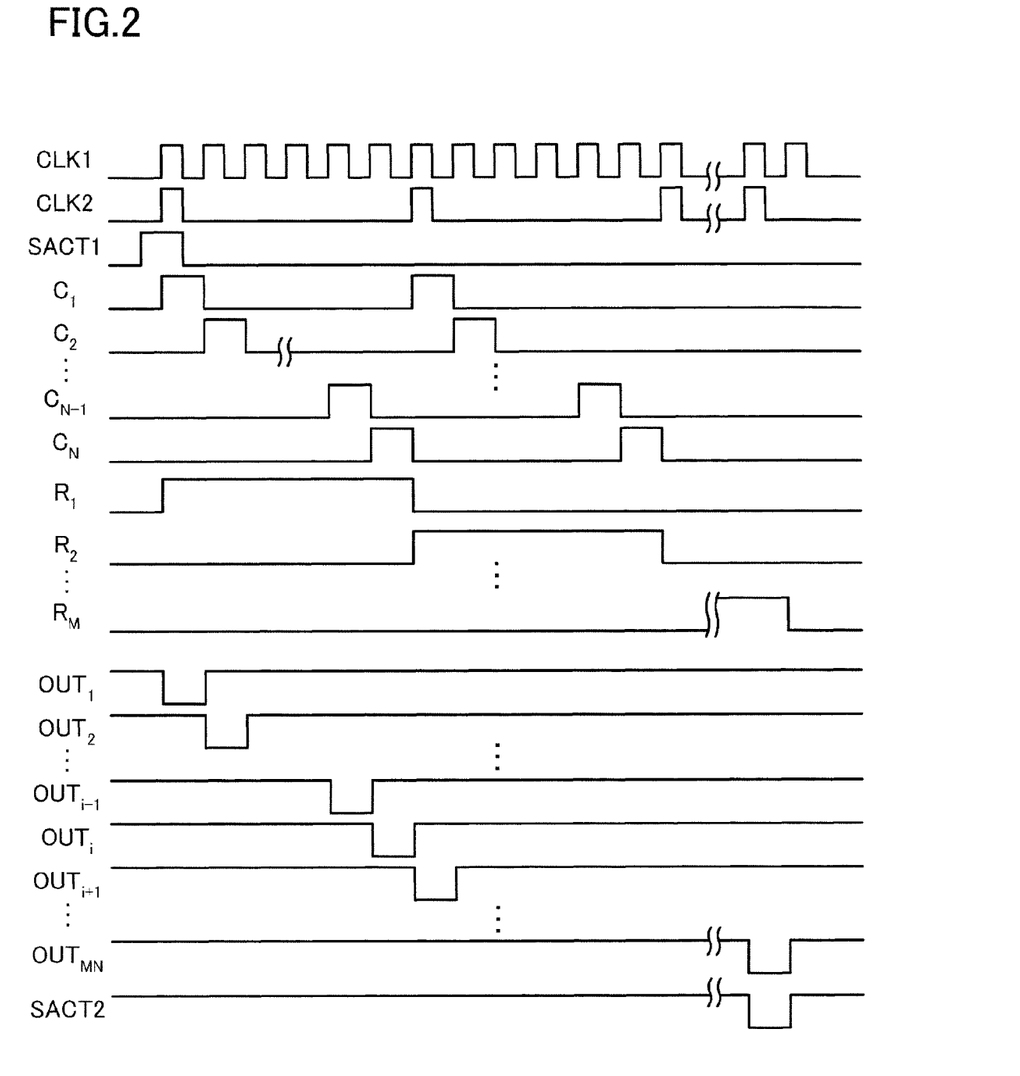
FIG. 2 is a timing chart of the display panel drive device of FIG. 1.

Next, the operation of the display panel drive device 10 of this embodiment will be described with reference to FIG. 2. In FIG. 2, OUT1 and OUTMN respectively correspond to the top-left OUT and the bottom-right OUT in FIG. 1. The flipflop 101_1 is set by SACT1, and C1 to CN sequentially go high in synchronization with CLK1. Similarly, the flipflop 151_1 is set by SACT1, and R1 to RM sequentially go high in synchronization with CLK2. Then, logical operations are performed between C1 to CN and R1 to RM, to cause OUT1 to OUTMN to go low sequentially.

As described above, according to this embodiment, N×M scanning line drive signals can be generated by N+M flipflops.

Figure 5:
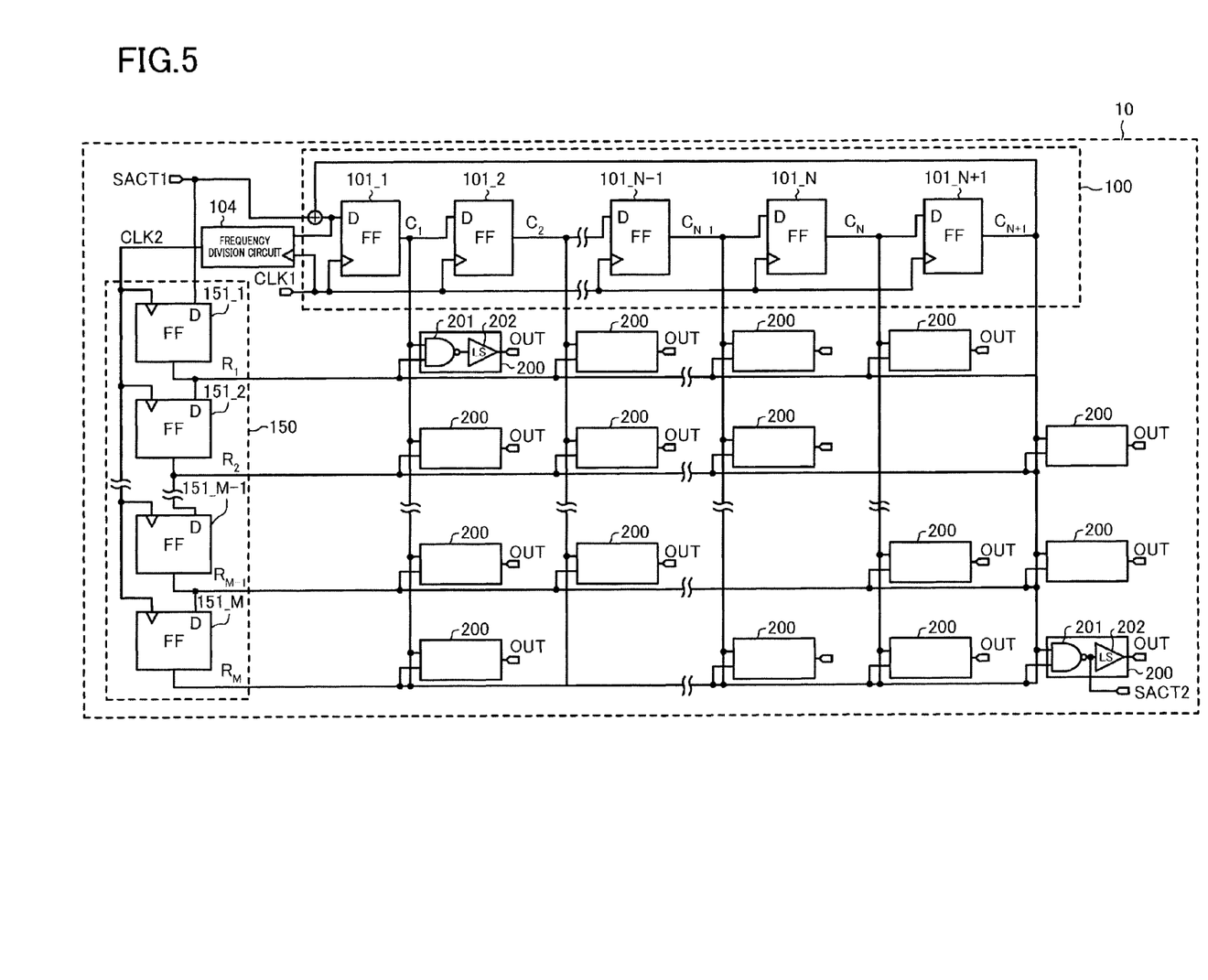
FIG. 5 is a block diagram of yet another alteration of the display panel drive device of FIG. 1.

Note that the ring counter of the ring counter circuit 100 may have one redundant flipflop as shown in FIG. 5. In this case, since the total number of output sections 200 does not change, one of the output sections 200 arranged in each row in FIG. 5 may be omitted. By this arrangement, N×M scanning line drive signals can be generated by (N+1)+M flipflops. The number of redundant flipflops in the ring counter may otherwise be 2 or more.

<Second Embodiment>

Figure 6:
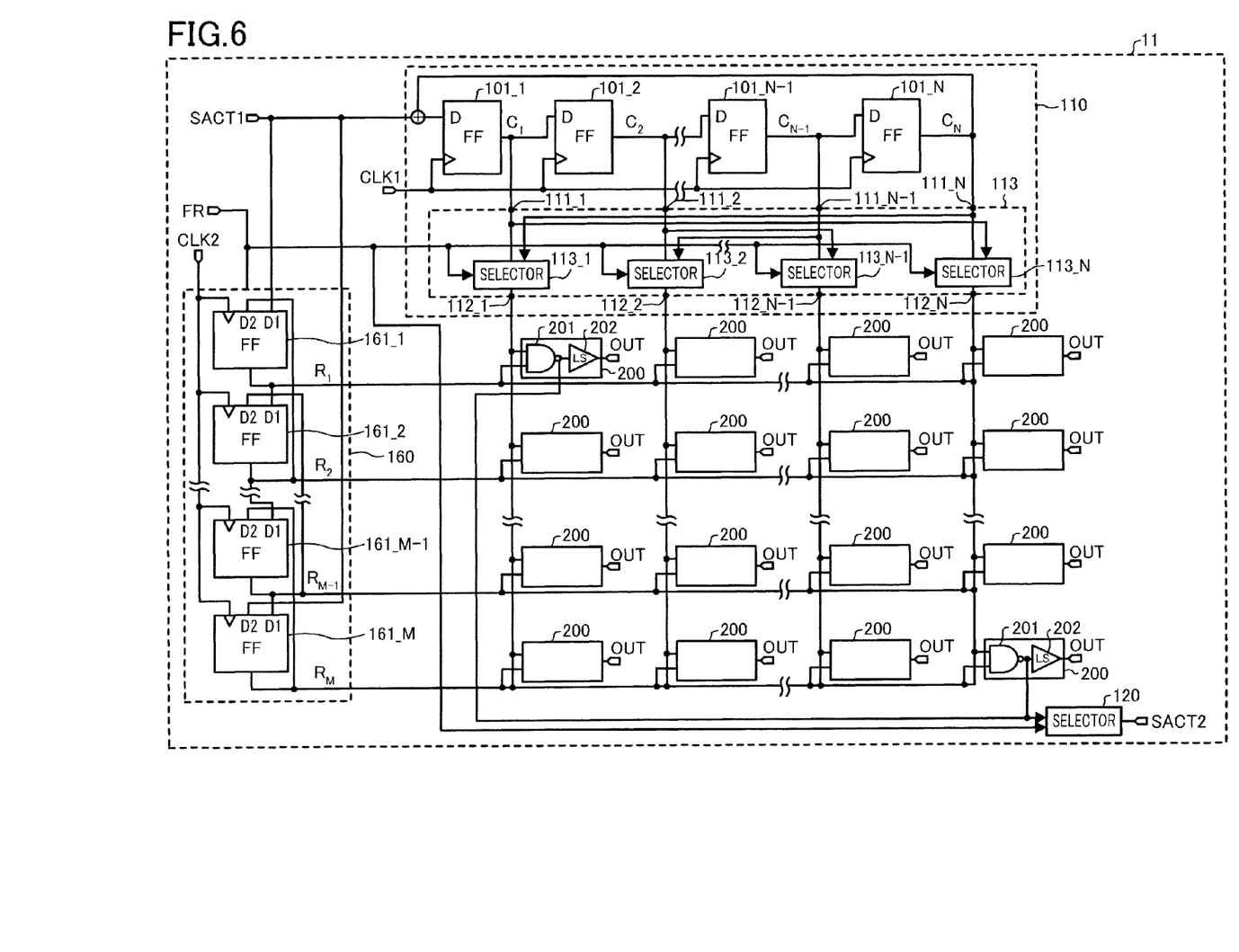
FIG. 6 is a block diagram of a display panel drive device of the second embodiment.

FIG. 6 is a block diagram of a display panel drive device of the second embodiment. The difference of this embodiment from the first embodiment will be described hereinafter.

A ring counter circuit 110 has a connection switch section 113 that switches the connections between output terminals 111_1 to 111_N of the flipflops 101_1 to 101_N and output terminals 112_1 to 112_N of the ring counter circuit 110, between straight connection and reverse connection, according to a control signal FR. The connection switch section 113 can be comprised of a plurality of selectors 113_1 to 113_N.

The selector 113_1 selectively connects either one of the output terminal 111_1 and the output terminal 111_N to the output terminal 112_1 according to FR. The selector 113_2 selectively connects either one of the output terminal 111_2 and the output terminal 111_N−1 to the output terminal 112_2 according to FR. The selector 113_N−1 selectively connects either one of the output terminal 111_2 and the output terminal 111_N−1 to the output terminal 112_N−1 according to FR. The selector 113_N selectively connects either one of the output terminal 111_1 and the output terminal 111_N to the output terminal 112_N according to FR.

A shift register 160 is configured such that the first-stage flipflop can be switched between the flipflops 161_1 and 161_M according to FR. Also, the shift register 160 is configured so that the shift direction can be changed according to FR. The shift register 160 performs a forward shift using signals input at D1 terminals of the flipflops 161_1 to 161_M, and performs a backward shift using signals input at D2 terminals of the flipflops 161_1 to 161_M.

A selector 120 selects either one of the output of the logic circuit 201 of the output section 200 that outputs OUT first and the output of the logic circuit 201 of the output section 200 that outputs OUT last, and outputs the selected output as SACT2.

Next, the operation of the display panel drive device 11 of this embodiment will be described. In the case of the forward shift, the connection switch section 113 performs the straight connection between the output terminals 111_1 to 111_N and the output terminals 112_1 to 112_N. Specifically, the selector 113-1 connects the output terminal 111_1 to the output terminal 112_1. The other selectors 113_2 to 113_N respectively connect the output terminals 111_2 to 111_N to the output terminals 112_2 to 112_N.

In the case of the backward shift, the connection switch section 113 performs the reverse connection between the output terminals 111_1 to 111_N and the output terminals 112_1 to 112_N. Specifically, the selector 113-1 connects the output terminal 111_N to the output terminal 112_1. The other selectors 113_2 to 113_N respectively connect the output terminals 111_N−1 to 111_1 to the output terminals 112_2 to 112_N.

As described above, according to this embodiment, the output order of OUTs can be reversed. Note that the connection switch section 113 of the ring counter circuit 110 may be omitted, and, instead, the first-stage flipflop may be switched between the flipflops 101_1 and 101_N, and the shift direction may be changed, according to FR. Alternatively, the shift register 160 may be provided with a connection switch section similar to the connection switch section 113. Otherwise, while the connection switch section 113 of the ring counter circuit 110 may be omitted, and, instead, the first-stage flipflop may be switched between the flipflops 101_1 and 101_N, and the shift direction may be changed, according to FR, the shift register 160 may be provided with a connection switch section similar to the connection switch section 113.

<Third Embodiment>

Figure 7:
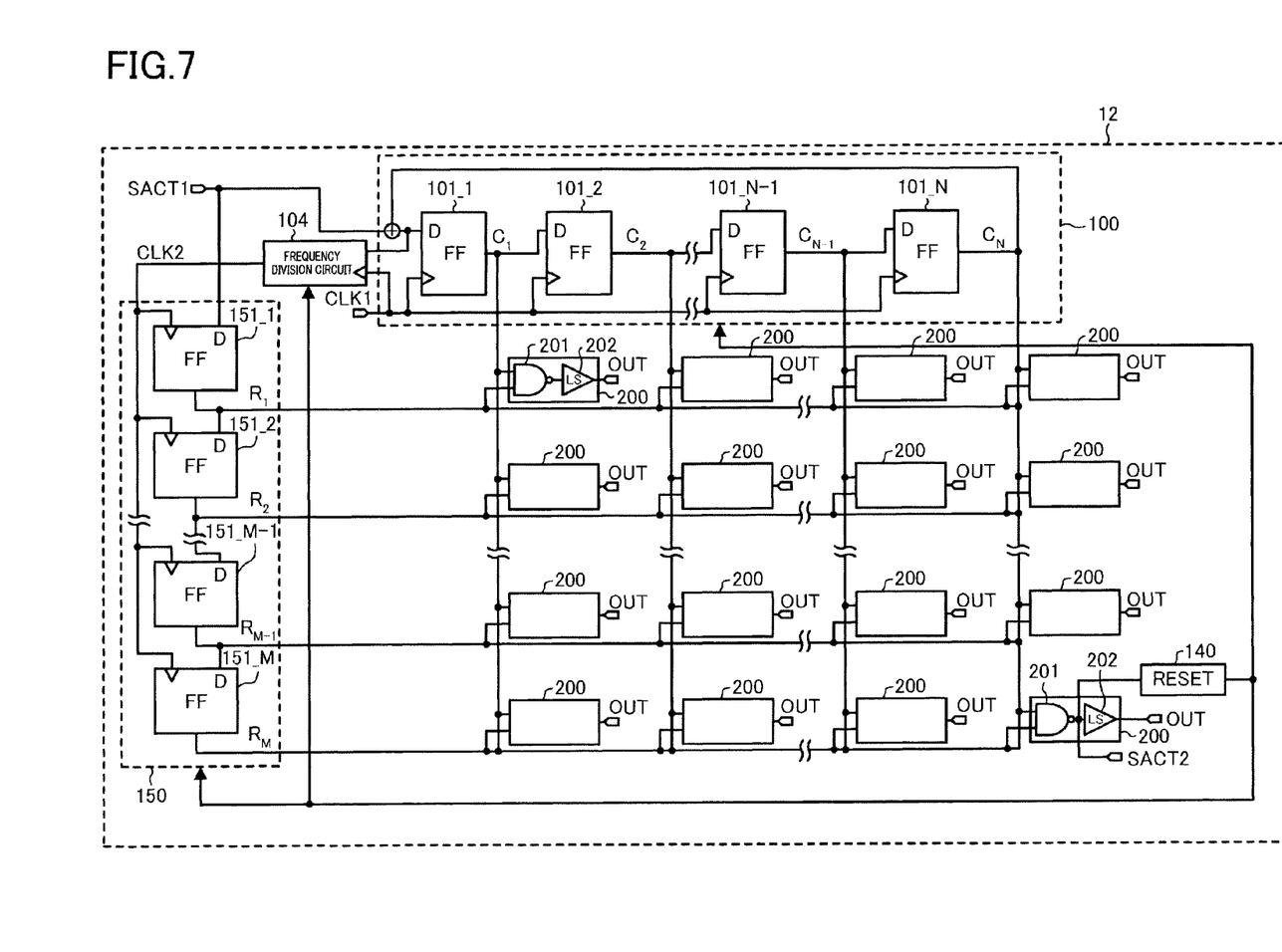
FIG. 7 is a block diagram of a display panel drive device of the third embodiment.

FIG. 7 is a block diagram of a display panel drive device of the third embodiment. The difference of this embodiment from the first embodiment will be described hereinafter.

A reset circuit 140 resets the ring counter of the ring counter circuit 100, the shift register 150, and the frequency division circuit 104 at the timing at which the final OUT is output from the display panel drive device 12, for example. The reset circuit 140 may have a flipflop inserted therein to adjust the timing. Note that the reset circuit 140 may output the reset signal at the timing at which any given OUT is output, or may output the reset signal once having received an external signal given at arbitrary timing. Note also that the reset circuit 140 may reset only the ring counter.

In the embodiments described above, the ring counter circuit may have two ring counters. An example configuration where the ring counter circuit is comprised of two ring counters will be described hereinafter.

<Fourth Embodiment>

Figure 8:
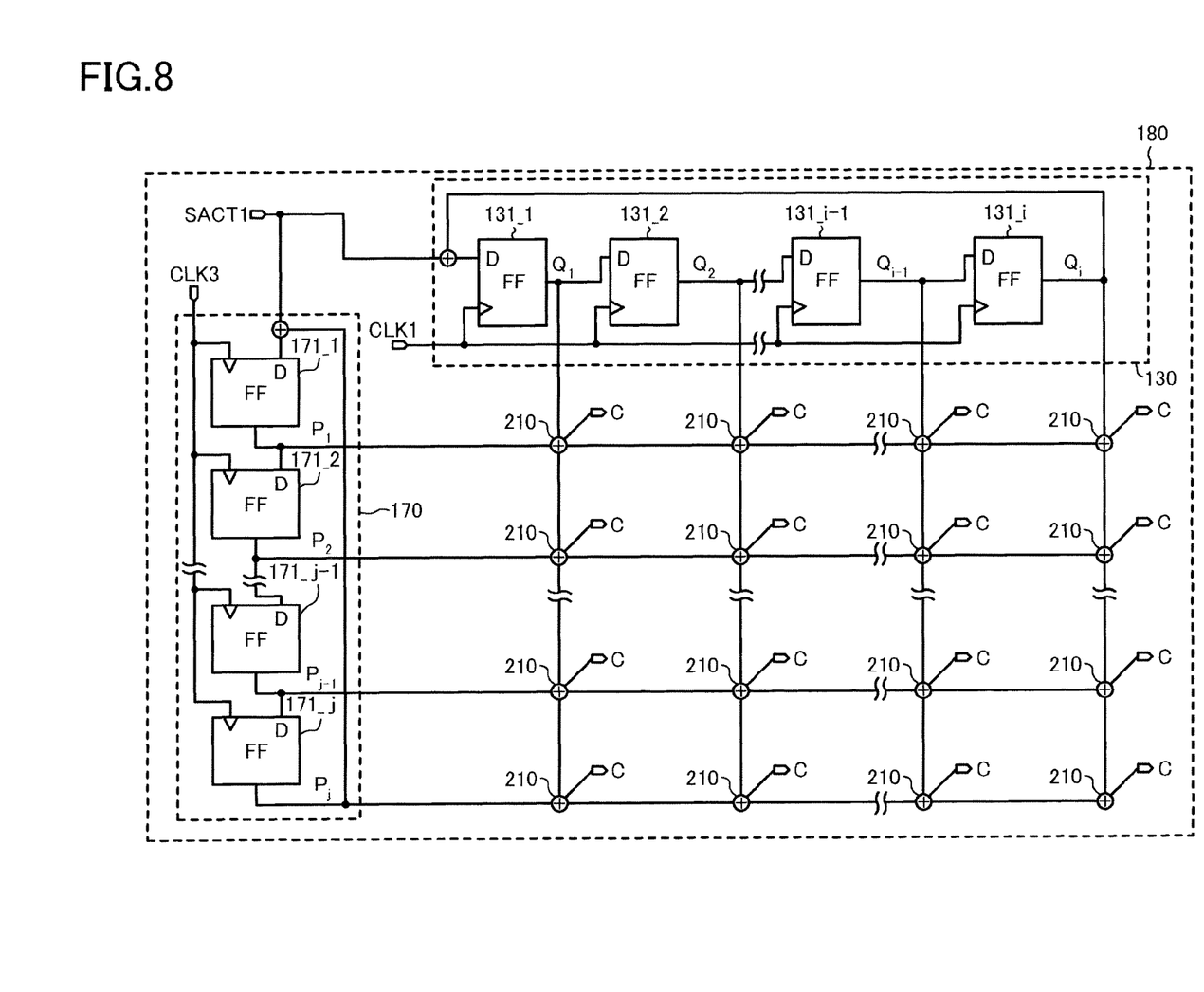
FIG. 8 is a block diagram of a ring counter circuit of the fourth embodiment.

FIG. 8 is a block diagram of a ring counter circuit of the fourth embodiment. As shown in FIG. 8, the ring counter circuit 180 can be comprised of a first ring counter 130, a second ring counter 170, and a plurality of output sections 210 that generate output signals C.

The first ring counter 130 can be comprised of i stages of flipflops 131_1 to 131_i connected in cascade. The flipflops 131_1 to 131_i operate in synchronization with the clock signal CLK1 and output Q1 to Qi, respectively. The first-stage flipflop 131_1 receives a signal obtained by logically combining the scanning line active signal SACT1 as the initial signal and the output Qi of the final-stage flipflop 131_i. Note that, if the first-stage flipflop 131_1 has a set terminal, it may be directly set by SACT1.

The second ring counter 170 can be comprised of j stages of flipflops 171_1 to 171_j connected in cascade. The flipflops 171_1 to 171_j operate in synchronization with a clock signal CLK3 and output P1 to Pj, respectively. CLK3 is a signal lower in frequency than CLK1. For example, it is a signal obtained by dividing the frequency of CLK1 by i. Alternatively, the frequency division circuit 104 shown in FIG. 3 may be provided, for dividing the frequency of CLK1 by i to generate CLK3 (see FIG. 3). Otherwise, the output Q1 of the flipflop 131_1 may be used as CLK3. That is, the output of any one flipflop in the first ring counter 130 may be used as CLK3.

Returning back to FIG. 8, the first-stage flipflop 171_1 receives a signal obtained by logically combining the scanning line active signal SACT1 as the initial signal and the output Pj of the final-stage flipflop 171_j. Note that, if the first-stage flipflop 171_1 has a set terminal, it may be directly set by SACT1.

The output sections 210 have similar configurations to one another. Herein, therefore, description will be made using the configuration of the top-left output section 210 as viewed from FIG. 8. The output section 210 can be comprised of an AND circuit that performs a logical operation between the output Q1 of the flipflop 131_1 and the output P1 of the flipflop 171_1. In other words, the ring counter circuit 180 performs logical operations between the outputs Q1 to Qi of the flipflops 131_1 to 131_i and the outputs P1 to Pj of the flipflops 171_1 to 171_j, and outputs the results of the logical operations as the output signals C.

Figure 9:
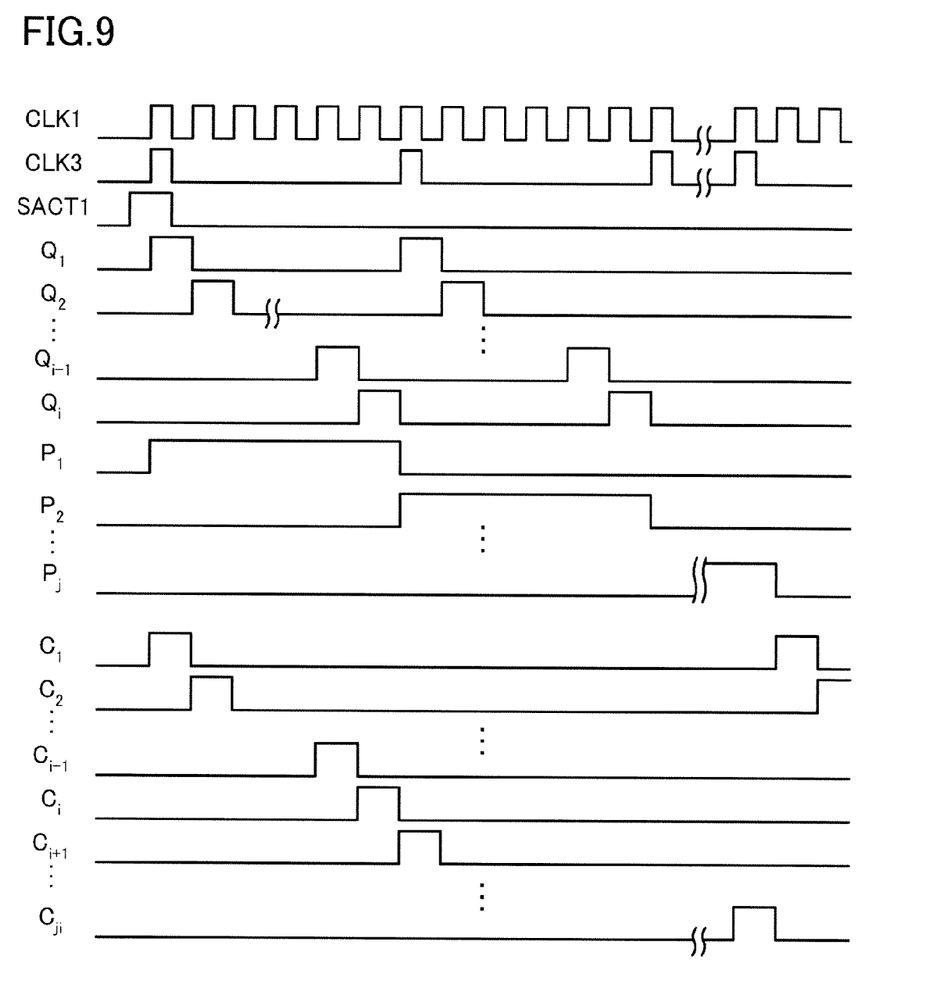
FIG. 9 is a timing chart of the ring counter circuit of FIG. 8.

Next, the operation of the ring counter circuit 180 of this embodiment will be described with reference to FIG. 9. Note that C1 and Cji in FIG. 9 respectively correspond to the top-left C and the bottom-right C in FIG. 8. The flipflop 131_1 is set by SACT1, and Q1 to Qi sequentially go high in synchronization with CLK1. Similarly, the flipflop 171_1 is set by SACT1, and P1 to Pj sequentially go high in synchronization with CLK3. Then, logical operations are performed between Q1 to Qi and P1 to Pj, to cause C1 to Cji to go high sequentially.

As described above, according to this embodiment, i+j flipflops included in the two ring counters 130 and 170 can constitute the ring counter circuit 180 that outputs i×j signals. Therefore, by using such a ring counter circuit 180 having a two-dimensional configuration as in this embodiment as the ring counter circuit 100 in FIG. 1, N (N=i×j)×M scanning line drive signals can be generated by M+i+j flipflops.

Note that, since a ring counter of the ring counter circuit 100 is allowed to include a redundant flipflop as shown in FIG. 5, the first ring counter 130 in this embodiment may have one redundant flipflop. In this case, since the total number of output sections 210 does not change, one of the output sections 210 arranged in each row in FIG. 8 may be omitted. By this arrangement, (i+1)+j flipflops can constitute the ring counter circuit 180 that outputs i×j signals. The number of redundant flipflops in the first ring counter 130 may otherwise be 2 or more.

When the ring counter circuit 180 of this embodiment is used as the ring counter circuit 110 shown in FIG. 6, such a configuration that the output order of the outputs C from the ring counter circuit 180 can be reversed according to the control signal FR may be established.

Also, when the ring counter circuit 180 of this embodiment is used as the ring counter circuit 100 shown in FIG. 7, both the first and second ring counters 130 and 170 may be reset by the reset circuit 140.

Moreover, although the ring counter circuit 180 includes two ring counters 130 and 170 in this embodiment, it is easy to constitute the ring counter circuit 180 by three or more ring counters (e.g., first to third ring counters). In this case, the first to third ring counters may operate in synchronization with clock signals different in frequency from one another, and each output section 210 may perform a logical operation among outputs, one each, of the first to third ring counters. In this case, the result of this logical operation will be one output of the ring counter circuit 180. In this configuration, the number of flipflops used in the ring counter circuit will be the order of a radical root of the number of outputs of the ring counter circuit.

In the embodiments described above, the components may operate by signals logically opposite to the signals described above.

The display panel drive device of the present disclosure, of which the circuit area can be reduced, is useful in TV apparatuses having various types of flat panel displays.

What is claimed is:

1. A display panel drive device comprising:
a ring counter circuit that includes a first ring counter having a plurality of flipflops connected in cascade, configured to operate in synchronization with a first clock signal with a first-stage one of the plurality of flipflops being set by an initial signal, and outputs signals using outputs of the plurality of flipflops;
a shift register having a plurality of flipflops connected in cascade, configured to operate in synchronization with a second clock signal lower in frequency than the first clock signal with a first-stage one of the plurality of flipflops being set by the initial signal; and an output section configured to perform a logical operation between one of outputs of the ring counter circuit and one of outputs of the shift register, to generate a scanning line drive signal for a display panel.

2. The display panel drive device of claim 1, further comprising:
a frequency division circuit configured to divide the frequency of the first clock signal to generate the second clock signal.

3. The display panel drive device of claim 1, wherein the second clock signal is an output of any one of the flipflops of the first ring counter.

4. The display panel drive device of claim 1, wherein the first ring counter and the shift register are configured such that the first-stage one of the plurality of flipflops and the shift direction changed according to a common control signal.

5. The display panel drive device of claim 1, wherein
the ring counter circuit has a connection switch section that switches connections between output terminals of the plurality of flipflops of the first ring counter, between straight connection and reverse connection, according to a control signal, and
the shift register is configured such that the first-stage one of the plurality of flipflops and the shift direction changed according to the control signal.

6. The display panel drive device of claim 1, wherein
the shift register has a connection switch section that switches connections between output terminals of the plurality of flipflops of the shift register, between straight connection and reverse connection, according to a control signal, and
the first ring counter is configured such that the first-stage one of the plurality of flipflops and the shift direction changed according to the control signal.

7. The display panel drive device of claim 1, wherein
the ring counter circuit has a connection switch section that switches connections between output terminals of the plurality of flipflops of the first ring counter, between straight connection and reverse connection, according to a control signal, and
the shift register has a connection switch section that switches connections between output terminals of the plurality of flipflops of the shift register, between straight connection and reverse connection, according to the control signal.

8. The display panel drive device of claim 1, further comprising:
a reset circuit configured to reset the first ring counter.

* * * * *